(12) United States Patent
Shoji et al.

(10) Patent No.: US 10,584,205 B2
(45) Date of Patent: Mar. 10, 2020

(54) PHOTOSENSITIVE RESIN COMPOSITION

(71) Applicant: TORAY Industries, Inc., Tokyo (JP)

(72) Inventors: Yu Shoji, Otsu (JP); Yuki Masuda, Otsu (JP); Yutaro Koyama, Otsu (JP); Ryoji Okuda, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 3 days.

(21) Appl. No.: 15/557,623

(22) PCT Filed: Mar. 18, 2016

(86) PCT No.: PCT/JP2016/058763
§ 371 (c)(1),
(2) Date: Sep. 12, 2017

(87) PCT Pub. No.: WO2016/152794
PCT Pub. Date: Sep. 29, 2016

(65) Prior Publication Data
US 2018/0066107 A1    Mar. 8, 2018

(30) Foreign Application Priority Data

Mar. 24, 2015  (JP) .................................. 2015-060465

(51) Int. Cl.
| | | |
|---|---|---|
| *C08K 5/39* | (2006.01) | |
| *C08G 69/26* | (2006.01) | |
| *G03F 7/023* | (2006.01) | |
| *G03F 7/20* | (2006.01) | |
| *C08K 5/38* | (2006.01) | |
| *C08L 79/02* | (2006.01) | |
| *H01L 21/02* | (2006.01) | |

(52) U.S. Cl.
CPC ................ *C08G 69/26* (2013.01); *C08K 5/38* (2013.01); *C08K 5/39* (2013.01); *C08L 79/02* (2013.01); *G03F 7/023* (2013.01); *G03F 7/20* (2013.01); *H01L 21/02118* (2013.01)

(58) Field of Classification Search
CPC ..................................................... C08G 69/26

USPC ......................................................... 528/335
See application file for complete search history.

(56) References Cited

U.S. PATENT DOCUMENTS

| | | | |
|---|---|---|---|
| 2006/0110678 A1 | 5/2006 | Dueber et al. | |
| 2014/0335350 A1 | 11/2014 | Tanaka et al. | |

FOREIGN PATENT DOCUMENTS

| | | |
|---|---|---|
| EP | 3 267 254 A1 | 1/2018 |
| JP | 2007-58017 A | 3/2007 |
| JP | 2009-300578 A | 12/2009 |
| JP | 2010-229210 A | 10/2010 |
| JP | 2012-133091 A | 7/2012 |
| JP | 2013-200891 A | 10/2013 |
| JP | 2014-174235 A | 9/2014 |
| JP | 2014-224855 A | 12/2014 |
| JP | 2015-31724 A | 2/2015 |
| WO | WO 2014/045434 A1 | 3/2014 |

OTHER PUBLICATIONS

Invitation to Respond to Written Opinion dated Jun. 28, 2018, in Singapore Patent Application No. 11201707712T.
Extended European Search Report dated Aug. 20, 2018, in European Patent Application No. 16768697.1.
English translation of International Preliminary Report on Patentability and Written Opinion dated Oct. 5, 2017, in PCT International Application No. PCT/JP2016/058763.
International Search Report, issued in PCT/JP2016/058763, PCT/ISA/210, dated Jun. 7, 2016.
Written Opinion of the International Searching Authority, issued in PCT/JP2016/08763, PCT/ISA/237, dated Jun. 7, 2016.
Invitation to Respond to Written Opinion dated Jun. 26, 2019, in Singapore Patent Application No. 11201707712T.

*Primary Examiner* — Duc Truong
(74) *Attorney, Agent, or Firm* — Birch, Stewart, Kolasch & Birch, LLP

(57) ABSTRACT

A highly sensitive photosensitive resin composition that can afford a cured film having a low stressfulness, a high degree of elongation, and an excellent adhesion to a metal material, copper among others, is provided. A photosensitive resin composition including an alkali-soluble resin having an organic group derived from an aliphatic diamine.

14 Claims, 2 Drawing Sheets

[Fig. 1]
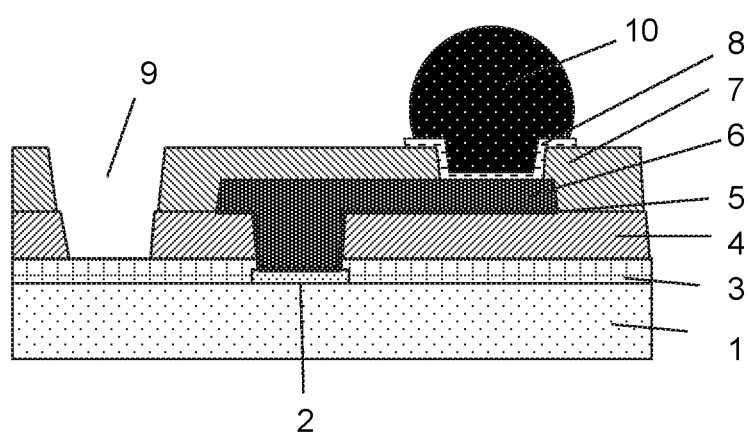

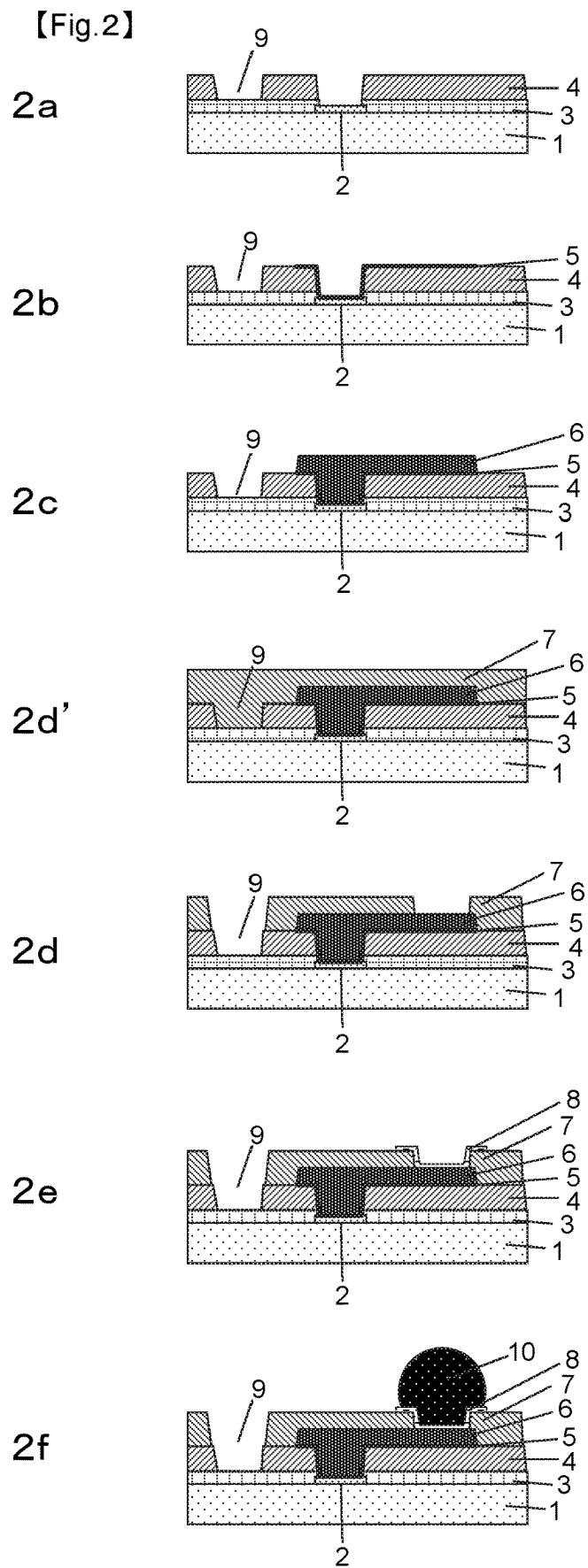

PHOTOSENSITIVE RESIN COMPOSITION

TECHNICAL FIELD

The present invention relates to a photosensitive resin composition. More particularly, the present invention relates to a photosensitive resin composition which is suitably used in a surface protective film, an interlayer dielectric film of semiconductor devices, and an insulating layer of organic electroluminescence elements, and the like.

BACKGROUND ART

Heretofore, polyimide-based and polybenzoxazole-based resins having excellent heat resistance and electrical insulation properties have widely been used in a surface protective film and an interlayer dielectric film of semiconductor devices, an insulating layer of organic electroluminescence elements, and a flattened film of TFT substrates. In addition, in order to enhance productivity, a photosensitive polyimide and a photosensitive polybenzoxazole have been considered. However, they are much reduced in the form of a film during development and are much affected by an environment in which they are used, and it has been pointed out that they are difficult to use in industry.

In addition, a photosensitive resin composition containing a polyimide having an alkoxymethyl group and a compound having 2 or more alkoxymethyl groups or methylol groups (Patent Literature 1), a positive-working photosensitive resin composition containing a polyhydroxystyrene resin and a compound having an alkoxymethyl group or a methylol group (Patent Literature 2), and a photosensitive resin composition in which a specific amount of an isocyanuric acid derivative having a specific structure is added to a polyhydroxyamide having a specific structure (Patent Literature 3) have been proposed, and have achieved an increased sensitivity and a lowered stressfulness. In recent years, however, the increasing degree of integration of semiconductor devices has been accompanied by a demand for the reduction of heat load on semiconductor devices in production processes and further by a demand for the reduction of the warpage caused to a substrate wafer by a thicker film of an insulating material, but the above-described materials cause a large film shrinkage after high temperature baking, generate a high stress to a substrate wafer, and thus increase the warpage of a substrate material, posing a problem, which remains to be solved adequately.

Proposed for this is a method in which a flexibility group is introduced into a repeating unit of an alkali-soluble cyclized polyimide or polybenzoxazole, whereby stress generated in producing a cured film is suppressed to achieve a lower warpage (Patent Literature 4).

CITATION LIST

Patent Literature

Patent Literature 1: JP 2010-229210 A
Patent Literature 2: JP 4692219 B2
Patent Literature 3: JP 2008-129071 A
Patent Literature 4: JP 2012-234030 A

SUMMARY OF INVENTION

Technical Problem

However, cyclized polyimides having a flexibility group have a problem in that they reduce mechanical characteristics although they can achieve a lower stressfulness. In addition, polybenzoxazoles having a flexibility group that are synthesized from aliphatic dicarboxylic acids have a problem in that an increase in stress due to the cyclodehydration of the polybenzoxazole during curing is caused to a substrate wafer.

In another respect, when a heat-resistant resin composition is used for applications for semiconductors and the like, the heat-cured film remains as a permanent film in a device, which means that the properties of the film cured after being heated are very important. In order to secure reliability in semiconductor packages, the adhesion to a material formed on the surface of a semiconductor chip is important, and in particular when a heat-resistant resin composition is used for applications such as for an insulating film between wiring layers of a wafer level package, the adhesion to a metal material used for electrodes and wiring is important. However, it is generally considered that, because of having a rigid main-chain structure, a heat-resistant resin has an adhesion strength that is not high to a metal material, and particularly in a cured resin film formed out of a resin composition with photosensitivity imparted thereto, the composition includes additives such as a photosensitizer, a sensitizer, an acid generator, and a solubility adjusting agent, which still remain in the cured film after heat-curing, resulting in the cured resin film having a lower adhesion strength than one which does not contain such additives. Accordingly, there is a problem in that resin compositions having an additive has a low adhesion to metals used as wiring materials.

The present invention has solved problems posed by the above-described conventional technologies and provides a high sensitivity photosensitive resin composition capable of affording a cured film having a lower stressfulness and a higher degree of elongation.

Solution to Problem

In order to achieve the above object, the present invention relates to the following:

[1] A photosensitive resin composition including an alkali-soluble resin having an organic group derived from an aliphatic diamine.

[2] The photosensitive resin composition according to [1], in which the alkali-soluble resin having an organic group derived from the aliphatic diamine is (A) an alkali-soluble polyamide represented by the general formula (1):

[Chem. 1]

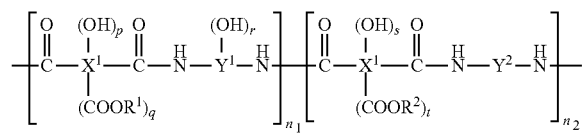

wherein, in the general formula (1), $X^1$ and $X^2$ represent a bivalent organic group; $Y^1$ represents a bi- to tetravalent organic group; $Y^2$ represents a bivalent organic group having a $C_{2\ or\ more}$ aliphatic structure; $R^1$ and $R^2$ represent hydrogen or a $C_1$-$C_{20}$ organic group; p, q, r, s, and t are integers satisfying $0 \leq p \leq 4$, $0 \leq q \leq 4$, $0 \leq r \leq 2$, $0 \leq s \leq 4$, and $0 \leq t \leq 4$; when p, q, r, s, or t is 0, each group represents a hydrogen atom; and $n_1$ and $n_2$ are integers satisfying $1 \leq n_1 \leq 500$, $1 \leq n_2 \leq 500$, and $0.05 \leq n_1/(n_1+n_2) < 1$.

[3] The photosensitive resin composition according to [1] or [2], in which $Y^2$ in the general formula (1) has a structural unit represented by the general formula (2):

[Chem. 2]

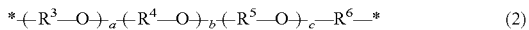

$$*{-}(R^3{-}O{)}_a{-}(R^4{-}O{)}_b{-}(R^5{-}O{)}_c{-}R^6{-}* \quad (2)$$

wherein, in the general formula (2), $R^3$ to $R^6$ each independently represent a $C_2$-$C_{10}$ alkylene group; a, b, and c each are integers satisfying $0 \le a \le 20$, $0 \le b \le 20$, and $0 \le c \le 20$; the repeating units are arranged in blocks or randomly; and, in the general formula (2), "." represents a chemical bond.

[4] The photosensitive resin composition according to any of [1] to [3], in which $Y^2$ in the general formula (1) has a molecular weight of from not less than 150 to not more than 2,000.

[5] The photosensitive resin composition according to any of [1] to [4], including (A) the alkali-soluble polyamide represented by the general formula (1), (B) a compound that generates an acid by light, and (C) a thermal cross-linking agent.

[6] The photosensitive resin composition according to any of [1] to [5], further including (D) a compound represented by the general formula (3):

[Chem. 3]

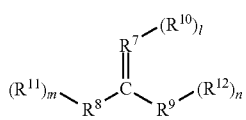

(3)

wherein, in the general formula (3), $R^7$ to $R^9$ represent an O atom, a S atom, or a N atom; at least one of $R^7$ to $R^9$ represents a S atom; l is 0 or 1; m and n represent an integer of 0 to 2; and $R^{10}$ to $R^{12}$ each independently represent a hydrogen atom or a $C_1$-$C_{20}$ organic group.

[7] A photosensitive sheet formed of the photosensitive resin composition according to any of [1] to [6].

[8] A method for producing a photosensitive sheet, including the step of coating a base material with the photosensitive resin composition according to any of [1] to [6] and drying the composition.

[9] A cured film obtained by curing the photosensitive resin composition according to any of [1] to [6].

[10] A cured film obtained by curing the photosensitive sheet according to [7].

[11] An interlayer dielectric film or a semiconductor protective film including the cured film according to [9].

[12] A method for producing a cured relief pattern, including the steps of: coating a substrate with the photosensitive resin composition according to any of [1] to [6] and drying the composition to form a photosensitive resin film; exposing the photosensitive resin film to light through a mask; dissolving or removing the exposed parts using an alkaline solution; and heating the developed photosensitive resin film.

[13] A method for producing a semiconductor electronic component or a semiconductor device, including the steps of: laminating the photosensitive sheet according to [7] or the photosensitive sheet produced by the method according to [8] on a substrate; then carrying out a UV-irradiation step and a developing step to form a pattern thereon; and further heating the resultant to form a relief pattern layer of a cured film.

[14] A semiconductor electronic component or a semiconductor device including the relief pattern layer of the cured film according to [9] or [10].

[15] The semiconductor electronic component or the semiconductor device, in which the cured film according to [9] or [10] is disposed as an interlayer dielectric film between rewiring layers.

[16] The semiconductor electronic component or the semiconductor device according to [15], in which layers each including the rewiring layer and interlayer dielectric film are disposed one on another two- to ten-fold.

[17] The semiconductor electronic component or the semiconductor device, in which the cured film according to [9] or [10] is disposed as an interlayer dielectric film covering two or more adjacent substrates made of different kinds of materials.

Advantageous Effects of Invention

The photosensitive resin composition according to the present invention is highly sensitive and can afford a cured film having a low stressfulness, a high degree of elongation, and an excellent adhesion to a metal material, copper among others. In addition, the electronic components according to the present invention are highly reliable because of having a good shape and adhesion and a pattern having an excellent heat resistance.

BRIEF DESCRIPTION OF DRAWINGS

FIG. 1 is a view depicting an enlarged cross-section of a pad portion of a semiconductor device having a bump.

FIG. 2 is a detailed view depicting a method for producing a semiconductor device having a bump.

DESCRIPTION OF EMBODIMENTS

The present invention is a photosensitive resin composition including an alkali-soluble resin having an organic group derived from an aliphatic diamine.

An alkali-soluble polyamide that is a base polymer of the photosensitive resin composition according to the present invention is an alkali-soluble polyamide having a repeating unit represented by the general formula (1) and is a polyamide that can be obtained by polycondensation of a dicarboxylic acid having a structure of $X^1(COOH)_2$ or $X^2(COOH)_2$ or a dicarboxylic derivative having a structure of $X^1(COZ)_2$ or $X^2(COZ)_2$ and a bisaminophenol and a diamine that have a structure of $Y^1(NH_2)_2(OH)_2$ and a structure of $Y^2(NH_2)_2$ respectively. In this regard, the bisaminophenol has two sets each including an amino group and a hydroxyl group that are ortho to each other, and when the polyamide is heated at about 250° C. to 400° C. and thus cyclodehydrated, the bisaminophenol site may turn to a benzoxazole. The base polymer of the positive-working photosensitive resin composition according to the present invention may be cyclized or not cyclized after heat-curing.

For the polyamide, the value of $n_1/(n_1+n_2)$ is preferably 0.05 or more, more preferably 0.5 or more, still more preferably 0.7 or more, most preferably 0.8 or more, from the viewpoint of solubility into an alkaline solution. In addition, the value of $n_1/(n_1+n_2)$ is preferably less than 1, more preferably 0.95 or less, from the viewpoint of low stressfulness.

Examples of dicarboxylic acids having a structure of $X^1(COOH)_2$ or $X^2(COOH)_2$ or dicarboxylic acid derivatives having a structure of $X^1(COZ)_2$ or $X^2(COZ)_2$ include, but are not limited to, aromatic groups having $X^1$ and $X^2$ selected from the following structural formulae:

[Chem. 4]

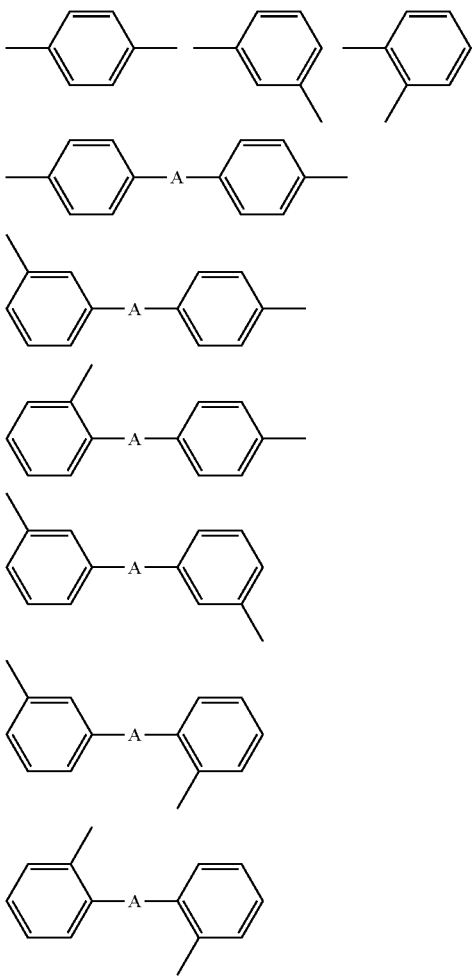

wherein A has a bivalent group selected from the group consisting of —, —O—, —S—, —SO$_2$—, —COO—, —OCO—, —CONH—, —NHCO—, —C(CH$_3$)$_2$—, —C(CF$_3$)$_2$—.

For dicarboxylic acid derivatives having structures of $X^1(COZ)_2$ and $X^2(COZ)_2$, it is preferable that Z be a $C_1$-$C_{12}$ organic group or a group selected from halogen elements, and be a group selected from the following structural formulae:

[Chem. 5]

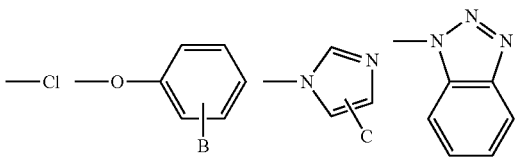

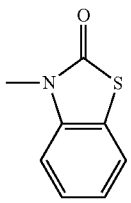

wherein B and C are, but are not limited to, a hydrogen atom, methyl group, ethyl group, propyl group, isopropyl group, t-butyl group, trifluoromethyl group, halogen group, phenoxy group, nitro group, or the like.

Examples of aminophenols having a structure of $Y^1(NH_2)_2(OH)_2$ include: hydroxyl-group-containing diamines such as bis(3-amino-4-hydroxyphenyl)hexafluoropropane, bis(3-amino-4-hydroxyphenyl)sulfone, bis(3-amino-4-hydroxyphenyl)propane, bis(3-amino-4-hydroxyphenyl)methylene, bis(3-amino-4-hydroxyphenyl)ether, bis(3-amino-4-hydroxy)biphenyl, and bis(3-amino-4-hydroxyphenyl)fluorene; and the like. Two or more of these diamine components may be used in combination.

For diamines having a structure of $Y^2(NH_2)_2$, $Y^2$ has an aliphatic structure and preferably has an alkylene oxide structural unit represented by the general formula (2).

For the component (A) used in the present invention, examples of diamines having as $Y^2$ a structural unit represented by the general formula (2) include: ethylenediamine, 1,3-diaminopropane, 2-methyl-1,3-propanediamine, 1,4-diaminobutane, 1,5-diaminopentane, 2-methyl-1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-cyclohexanediamine, 1,3-cyclohexanediamine, 1,4-cyclohexanediamine, 1,2-bis(aminomethyl)cyclohexane, 1,3-bis(aminomethyl)cyclohexane, 1,4-bis(aminomethyl)cyclohexane, 4,4'-methylene bis(cyclohexylamine), and 4,4'-methylene bis(2-methylcyclohexylamine); KH-511, ED-600, ED-900, ED-2003, EDR-148, EDR-176, D-200, D-400, D-2000, THF-100, THF-140, THF-170, RE-600, RE-900, RE-2000, RP-405, RP-409, RP-2005, RP-2009, RT-1000, HE-1000, HT-1100, and HT-1700, (which are trade names, manufactured by HUNTSMAN Corporation); and the like; and the diamines have only to contain an alkylene oxide structure and may contain a bond such as, but not limited to, —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, or —NHCONH—.

In addition, the alkali-soluble polyamide (A) represented by the general formula (1) used in the present invention (hereinafter may be referred to as component (A) for short) in which the molecular weight of a structural unit represented by the general formula (2) as $Y^2$ is 150 or more can inhibit a substrate wafer from undergoing a stress increase that can be caused along with cyclodehydration when the polyamide structure or the like of the component (A) is cyclized. In other words, the flexibility of the $Y^2$ component can relieve stress and achieve a lower stressfulness. In addition, incorporating a flexibility group having a low ultraviolet absorption can enhance i-line permeability and achieve a higher sensitivity at the same time. The molecular weight of a structural unit represented by the general formula (2) is preferably 150 or more, more preferably 600 or more, still more preferably 900 or more. In addition, the molecular weight is preferably 2,000 or less from the viewpoint of maintaining solubility into an alkaline solution, more preferably 1800 or less, still more preferably 1500 or less. The molecular weight is more preferably from 600 to 1,800, still more preferably from 900 to 1,500. Thus, a lower stressfulness and a higher sensitivity can be achieved.

The molecular weight of the $Y^2$ component in the component (A) resin can be measured with respect to a diamine monomer including a $Y^2$ structure by, for example, LC-MS, and be determined as a molecular weight of a main signal.

In addition, the component (A) used in the present invention may be copolymerized with another diamine in addition to a diamine having a structure of $Y^2(NH_2)_2$. Examples of such other diamines include, but are not limited to: aromatic diamines such as 3,4'-diaminodiphenyl ether, 4,4'-diaminodiphenyl ether, 3,4'-diaminodiphenylmethane, 4,4'-diaminodiphenylmethane, 3,4'-diaminodiphenyl sulfone, 4,4'-diaminodiphenyl sulfone, 3,4'-diaminodiphenylsulfide, 4,4'-diaminodiphenylsulfide, 1,4-bis(4-aminophenoxy)benzene, benzine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, and 2,2'-bis(trifluoromethyl)-4,4'-diaminobiphenyl; compounds each resulting from replacing some hydrogen atoms of the aromatic ring of each of the foregoing by a $C_1$-$C_{10}$ alkyl group, a fluoroalkyl group, a halogen atom, or the like; compounds having a structure shown below; and the like. Such other diamines to be copolymerized may be used without changes or may be used as corresponding diisocyanate compounds or trimethylsilylated diamines. Two or more of these diamine components may be used in combination.

[Chem. 6]

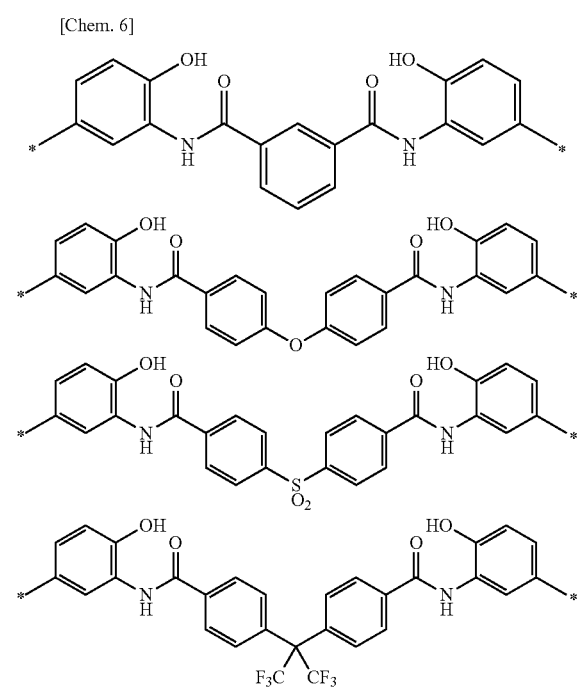

[Chem. 7]

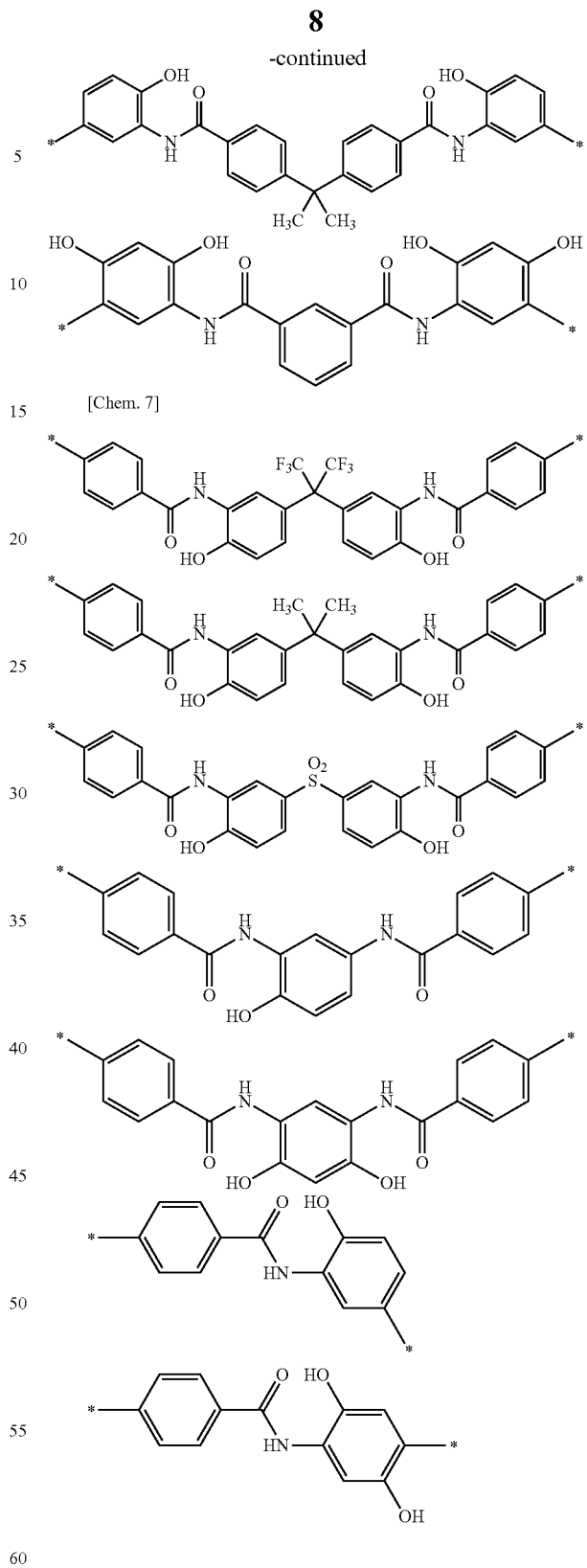

Furthermore, these components may be copolymerized with an aliphatic group having a siloxane structure to the extent that the heat resistance is not reduced, thereby making it possible to improve the adhesion to a substrate. Specific examples include those whose 1 to 15 mol % diamine component such as bis(3-aminopropyl)tetramethyldisiloxane or bis(p-amino-phenyl)octamethylpentasiloxane is copolymerized. The copolymerization of 1 mol % or more diamine component is preferable from the viewpoint that the adhesion to a substrate such as a silicon wafer is enhanced, and 15 mol % or less is preferable from the viewpoint that the solubility into an alkaline solution is not reduced.

In order to improve storage stability of the positive-working photosensitive resin composition, the main chain terminal of the component (A) resin is preferably blocked with a terminal blocking agent such as a monoamine, an acid anhydride, a monocarboxylic acid, a mono acid chloride compound, or a monoactive ester compound. In addition, by blocking the terminal of the resin with a terminal blocking agent that has a hydroxyl group, a carboxyl group, a sulfonic group, a thiol group, a vinyl group, an ethynyl group, or an allyl group, it is possible to readily control the rate of dissolution of the resin in the alkaline solution and the mechanical characteristics of the resulting cured film within preferred ranges. The ratio of a terminal blocking agent to be introduced is preferably 0.1 mol % or more, particularly preferably 5 mol % or more, relative to all amine components, in order to inhibit the solubility into an alkaline solution from being reduced by an increase in the molecular weight of the component (A) resin, and is preferably 60 mol % or less, particularly preferably 50 mol % or less, in order to inhibit the mechanical characteristics of the resulting cured film from being reduced by a decrease in the molecular weight of the component (A) resin. A plurality of different terminal groups may be introduced by allowing a plurality of terminal blocking agents to react.

Preferred examples of monoamines include: M-600, M-1000, M-2005, and M-2070 (which are trade names, manufactured by HUNTSMAN Corporation); aniline, 2-ethynylaniline, 3-ethynylaniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol; and the like. Two or more of them may be used in combination.

Preferred examples of acid anhydrides, monocarboxylic acids, monoacid chloride compounds, and mono-active ester compounds may include: acid anhydrides such as phthalic anhydride, maleic anhydride, nadic anhydride, cyclohexanedicarboxylic anhydride, and 3-hydroxyphthalic anhydride; monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, and 4-carboxybenzenesulfonic acid; monoacid chloride compounds with the carboxyl group of the monocarboxylic acid formed into an acid chloride; monoacid chloride compounds with only one carboxyl group of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene formed into an acid chloride; and active ester compounds obtained by reaction of a monoacid chloride compound with N-hydroxybenzotriazole, imidazole, or N-hydroxy-5-norbornene-2,3-dicarboxyimide. Two or more of them may be used in combination.

The terminal blocking agent introduced into the component (A) resin used in the present invention can be detected easily by the following methods. For example, the resin having the terminal blocking agent introduced thereinto is dissolved in an acidic solution to decompose the resin into an amine component and an acid anhydride component which are constituent units, and these components are subjected to a measurement by gas chromatography (GC) or NMR to detect the terminal blocking agent used in the present invention easily. Alternatively, the resin component having the terminal blocking agent introduced thereinto may be directly measured by thermal decomposition gas chromatography (PGC) or infrared or $^{13}$C-NMR spectroscopy to detect the terminal blocking agent easily.

In addition, the component (A) used in the present invention may be copolymerized with another structure such as polyimide as long as the structure contains a structure represented by the general formula (1).

The component (A) according to the present invention preferably has a weight-average molecular weight of 5,000 to 50,000. The weight-average molecular weight of 5,000 or more as determined in terms of polystyrene by GPC (gel permeation chromatography) can enhance resistance to bending after curing. On the other hand, the weight-average molecular weight of 50,000 or less can enhance developability with an alkaline solution. A weight-average molecular weight of 20,000 or more is more preferable in order to afford mechanical characteristics. When the composition contains two or more alkali-soluble polyamides, it is only necessary that at least one of them has a weight-average molecular weight in the above-described range.

The solvent used in polymerization (hereinafter referred to as polymerization solvent) is not limited to a particular kind, provided that the polymerization solvent dissolves tetracarboxylic dianhydrides and diamines which are raw monomers. Examples of polymerization solvents include: amides such as N,N-dimethylformamide, N,N-dimethylacetamide, N-methyl-2-pyrrolidone, 1,3-dimethyl-2-imidazolidinone, N,N'-dimethylpropyleneurea, N,N-dimethylisobutyric acid amide, methoxy-N,N-dimethylpropioneamide; cyclic esters such as γ-butyrolactone, γ-valerolactone, δ-valerolactone, γ-caprolactone, ε-caprolactone, and α-methyl-γ-butyrolactone; carbonates such as ethylene carbonate and propylene carbonate; glycols such as triethylene glycol; phenols such as m-cresol and p-cresol; acetophenone; 1,3-dimethyl-2-imidazolidinone; sulfolane; and dimethyl sulfoxide. Preferably 100 parts by mass or more of the polymerization solvent is used, more preferably 150 parts by mass or more is used, relative to 100 parts by mass of the resin to be obtained, in order to dissolve the resin obtained after reaction, and preferably 1,900 parts by mass or less is used, more preferably 950 parts by mass or less is used, in order to obtain the resin in powder form in collecting the precipitate.

In another aspect, the positive-working photosensitive resin composition according to the present invention is a positive-working photosensitive resin composition that contains (A) the alkali-soluble polyamide, (B) a compound that generates an acid by light (hereinafter may be referred to as component (B) for short), and (C) a thermal crosslinking agent. This positive-working photosensitive resin composition is not limited to a particular shape as long as it contains these components, and may be, for example, in a paste or sheet shape.

In addition, the photosensitive sheet according to the present invention refers to the photosensitive resin composition according to the present invention with which a support is coated, which is dried in the range of temperature and time that can volatilize a solvent, and formed into the shape of a sheet that is not completely cured, and which is soluble in an alkaline aqueous solution.

The support is not limited to a particular one, but various films that are usually commercially available such as polyethylene terephthalate (PET) films, polyphenylene sulfide films, and polyimide films can be used. A surface treatment such as with silicone, a silane coupling agent, an aluminum chelate agent, or polyurea may be provided for a joined face between the support and the photosensitive resin composition in order to enhance the adhesion and releasability. In addition, the thickness of the support is not limited to a particular value, but is preferably in the range of 10 to 100 µm from the viewpoint of workability. Further, in order to protect the surface of the photosensitive composition film obtained by coating, a protective film may be provided on the film surface. This can protect the surface of the photosensitive resin composition from pollutants such as dirt and dust in the atmosphere.

Examples of methods for coating the support with the photosensitive resin composition include methods such as spin-coating using a spinner, spray coating, roll coating, screen printing, blade coaters, die coaters, calender coaters, meniscus coaters, bar coaters, roll coaters, comma roll coaters, gravure coaters, screen coaters, and slit die coaters. In addition, the coating film thickness depends on the coating technique, the concentration of solid in the composition, the viscosity, and the like, but usually the film thickness achieved after drying is preferably 0.5 µm to 100 µm.

For drying, an oven, a hot plate, infrared ray, and the like can be used. The drying temperature and the drying time have only to be in a range in which a solvent can be volatilized, and are preferably set, as appropriate, in a range such that the photosensitive resin composition turns into the uncured or half-cured state. Specifically, it is preferably carried out in the range of 40° C. to 150° C. for one to tens of minutes. In addition, these temperatures may be combined and raised in a stepwise manner, and, for example, heat treatment may be carried out at 80° C. and 90° C., each for two minutes.

The photosensitive resin composition according to the present invention contains (B) a compound that generates an acid by light, i.e., a photosensitizer. A photosensitizer is a positive-working material that is solubilized by light, and a quinonediazide compound or the like is preferably used.

Examples of quinonediazide compounds include: a compound produced by binding quinonediazide sulfonic acid to a polyhydroxy compound via an ester bond; a compound produced by binding quinonediazide sulfonic acid to a polyamino compound via a sulfoneamide bond; and a compound produced by binding quinonediazide sulfonic acid to a polyhydroxyl polyamino compound via an ester bond and/or a sulfoneamide bond. All functional groups of these polyhydroxy compound, polyamino compound, and polyhydroxypolyamino compound are optionally not substituted with quinonediazide, but an average of 40 mol % or more of all functional groups is preferably substituted with quinonediazide. By using such a quinonediazide compound, a positive-working photosensitive resin composition which is photosensitive to i-line (wavelength of 365 nm), h-line (wavelength of 405 nm), and g-line (wavelength of 436 nm) of a mercury lamp, which are common ultraviolet rays, can be obtained.

Examples of polyhydroxy compounds include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylene tris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, HML-TPHAP (which are trade names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, TM-BIP-A (which are trade names, manufactured by Asahi Organic Chemicals Industry Co., Ltd.), 2,6-dimethoxymethyl-4-t-butyl phenol, 2,6-dimethoxymethyl-p-cresol, 2,6-diacetoxymethyl-p-cresol, naphthol, tetrahydroxybenzophenone, methyl gallate ester, bisphenol A, bisphenol E, methylene bisphenol, BisP-AP (which is a trade name, manufactured by Honshu Chemical Industry Co., Ltd.), a novolac resin, and the like.

Examples of the polyamino compound include, but are not limited to, 1,4-phenylenediamine, 1,3-phenylenediamine, 4,4'-diaminodiphenylether, 4,4'-diaminodiphenylmethane, 4,4'-diaminodiphenylsulfone, 4,4'-diaminodiphenyl sulfide, and the like.

Examples of the polyhydroxypolyamino compound include, but are not limited to, 2,2-bis(3-amino-4-hydroxyphenyl)hexafluoropropane, 3,3'-dihydroxybenzidine, and the like.

Among these, it is more preferred that the quinonediazide compound contains an ester of a phenol compound and a 4-naphthoquinonediazidesulfonyl group. Thus, a high sensitivity and a higher resolution can be obtained by i-line exposure.

The content of the quinonediazide compound is preferably 1 to 50 parts by mass, more preferably 10 to 40 parts by mass, relative to 100 parts by mass of the resin as the component (A). An attempt can be made to achieve higher sensitivity by adjusting the content of the quinonediazide compound within the above range. Furthermore, a sensitizer may be added, as needed.

The positive-working photosensitive resin composition according to the present invention may contain (C) a thermal crosslinking agent. Specifically, a compound having at least two alkoxymethyl groups or methylol groups is preferable. Having at least two of these groups can afford a crosslinked structure through a condensation reaction with a resin and a similar molecule. Using these groups together with the component (B) allows a wider design for enhancing sensitivity and the mechanical characteristics of the cured film.

Preferred examples of such compounds include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DMLBisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, HMOM-TPHAP (which are trade names, manufactured by Honshu Chemical Industry Co., Ltd.), NIKALAC (registered trademark) MX-290, and NIKALAC MX-280, NIKALAC MX-270, NIKALAC MX-279, NIKALAC MW-100LM, NIKALAC MX-750LM (which are trade names, manufactured by Sanwa Chemical Co., Ltd.). Two or more of these may be contained. Among these, HMOM-TPHAP and MW-100LM are more preferable because the addition of them makes it less likely for reflow to occur during curing and makes the pattern into a high rectangle.

The content of the compound having at least two of alkoxymethyl groups or methylol groups is preferably 10 parts by mass or less relative to 100 parts by mass of the component (A). This range allows a wide design to be more suitably carried out for enhancing sensitivity and the mechanical characteristics of the cured film.

In addition, the photosensitive resin composition may contain a low molecular weight compound having a phenolic hydroxyl group, if necessary, as long as a shrinkage residual film rate after curing is not decreased. This can shorten the developing time.

Examples of these compounds include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X (which are trade names, manufactured by Honshu Chemical Industry Co., Ltd.), BIP-PC, BIR-PC, BIR-PTBP, BIR-BIPC-F (which are trade names, manufactured by Asahi Organic Chemicals Industry Co., Ltd.), and the like. Two or more of these may be contained.

The content of a low molecular weight compound having a phenolic hydroxyl group is preferably 1 to 40 parts by mass relative to 100 parts by mass of the component (A).

The positive-working photosensitive resin composition according to the present invention preferably contains a solvent. Examples of solvents include: polar aprotic solvents such as N-methyl-2-pyrrolidone, γ-butyrolactone, γ-valerolactone, δ-valerolactone, N,N-dimethylformamide, N,N-dimethylacetamide, dimethyl sulfoxide, 1,3-dimethyl-2-imidazolidinone, N,N'-dimethylpropyleneurea, N,N-dimethylisobutyric acid amide, and methoxy-N,N-dimethylpropioneamide; ethers such as tetrahydrofuran, dioxane, propylene glycol monomethyl ether, and propylene glycol monoethyl ether; ketones such as acetone, methyl ethyl ketone, and diisobutyl ketone; esters such as ethyl acetate, butyl acetate, isobutyl acetate, propyl acetate, propylene glycol monomethyl ether acetate, and 3-methyl-3-methoxybutyl acetate; alcohols such as ethyl lactate, methyl lactate, diacetone alcohol, and 3-methyl-3-methoxybutanol; aromatic hydrocarbons such as toluene and xylene; and the like. Two or more of these may be contained. The content of the solvent is preferably 100 parts by mass or more relative to 100 parts by mass of the component (A), in order to dissolve the composition, and is preferably 1,500 parts by mass or less in order to form a coating film having a film thickness of 1 μm or more.

The positive-working photosensitive resin composition according to the present invention may contain, as needed, surfactants; esters such as ethyl lactate and propylene glycol monomethyl ether acetate; alcohols such as ethanol; ketones such as cyclohexanone and methyl isobutyl ketone; and ethers such as tetrahydrofuran and dioxane; for the purpose of improving wettability with a substrate.

In order to enhance adhesion to the substrate, the positive-working photosensitive resin composition according to the present invention may contain, as a silicone component, silane coupling agents such as trimethoxyaminopropylsilane, trimethoxyepoxysilane, trimethoxyvinylsilane, and trimethoxythiolpropylsilane, as long as storage stability does not deteriorate. The content of the silane coupling agent is preferably 0.01 to 5 parts by mass relative to 100 parts by mass of the component (A).

The positive-working photosensitive resin composition according to the present invention may contain an alkali-soluble resin other than the component (A). Specific examples include alkali-soluble polyimides, polybenzoxazoles, acrylic polymers obtained by copolymerization of an acrylic acid, novolac resins, siloxane resins, and the like. These resins are soluble in a solution containing an alkali such as tetramethylammonium hydroxide, choline, triethylamine, dimethylaminopyridine, monoethanolamine, diethylaminoethanol, sodium hydroxide, potassium hydroxide, or sodium carbonate. The addition of any of these alkali-soluble resins makes it possible to impart the characteristics of this alkali-soluble resin while maintaining the adhesion and excellent sensitivity of the cured film.

The viscosity of the positive-working photosensitive resin composition according to the present invention is preferably 2 to 5,000 mPa·s. Adjusting the solid concentration to a viscosity of 2 mPa·s or more facilitates obtaining a desired film thickness. On the other hand, the viscosity of 5,000 mPa·s or less facilitates obtaining a highly uniform coating film. The positive-working photosensitive resin composition having such a viscosity can be easily obtained by having, for example, a solid concentration of 5 to 60 mass %.

The positive-working photosensitive resin composition according to the present invention that contains a compound represented by the following general formula (3) (hereinafter may be referred to as compound (D) for short) remarkably enhances the adhesion of the heat-cured film to a metal material, copper among others. This is because a S atom or N atom of the compound represented by the general formula (3) interacts with a metal surface and because the composition has a stereo structure that interacts more readily with a metal surface. These effects can impart photosensitivity to the resin composition, and afford a cured resin film having an excellent adhesion to a metal material even when the composition contains additives. In (D) the general formula (3), $R^7$ to $R^9$ represent any of an O atom, a S atom, or a N atom, and at least one of $R^7$ to $R^9$ represents a S atom. 1 represents 0 or 1, and m and n represent an integer of 0 to 2. $R^{10}$ to $R^{12}$ each independently represent a hydrogen atom or a $C_1$-$C_{20}$ organic group. Examples of $R^{10}$ to $R^{12}$ include a hydrogen atom, an alkyl group, cycloalkyl group, alkoxy group, alkyl ether group, alkylsilyl group, alkoxysilyl group, aryl group, aryl ether group, carboxyl group, carbonyl group, allyl group, vinyl group, heterocyclic group, combinations thereof, and the like, and may further contain a substituent.

The addition amount of the compound (D) represented by the general formula (3) is preferably 0.1 to 10 parts by weight relative to 100 parts by weight of the alkali-soluble polyamide (A). When the addition amount is less than 0.1 parts by weight, it is difficult to obtain the effect of enhancing adhesion to a metal material, and when the addition amount is more than 10 parts by weight, the interaction with a photosensitizer may unfavorably reduce the sensitivity of the resin composition. The addition amount of the compound (D) represented by the general formula (3) is 0.5 to 3.0 parts by weight.

In the compound (D) represented by the general formula (3) used in the present invention, $R^7$ to $R^9$ represent any of an O atom, a S atom, or a N atom, and at least one of $R^7$ to $R^9$ is preferably a S atom. In general, the composition to which a compound containing a N atom is added may have sensitivity impaired through the interaction between a photosensitizer and a compound containing a N atom, but when the compound contains a S atom, the interaction is suitably maintained, and the effect of enhancing adhesion can be obtained without lowering the sensitivity.
Examples of the compound (D) represented by the general formula (3) include, but are not limited to, the following structures:
[Chem. 8]
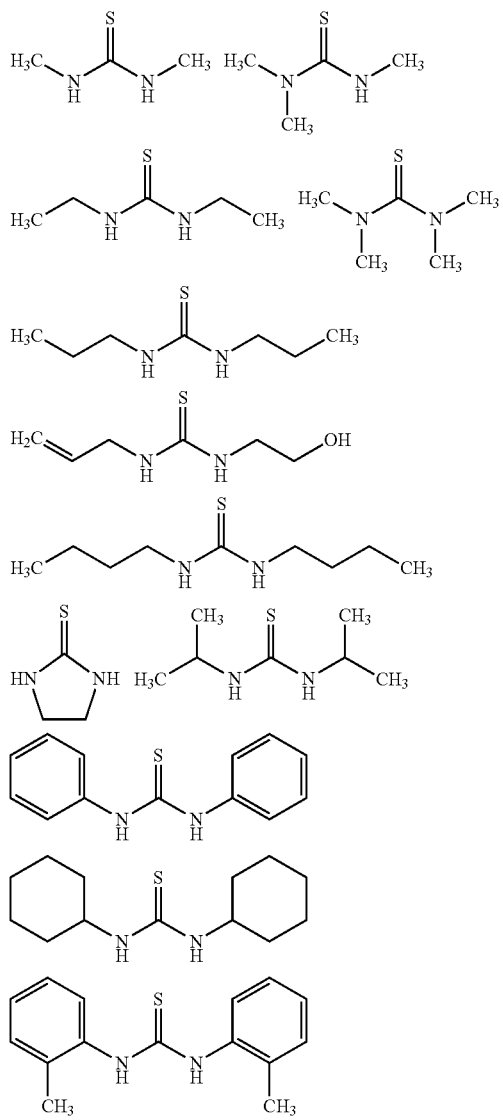
[Chem. 9]
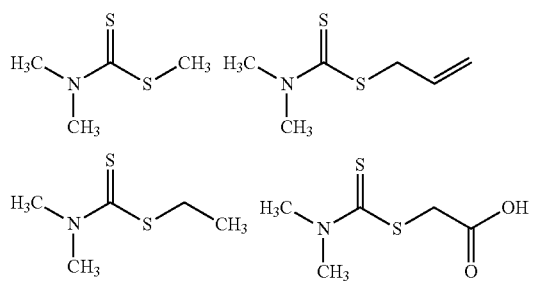
-continued
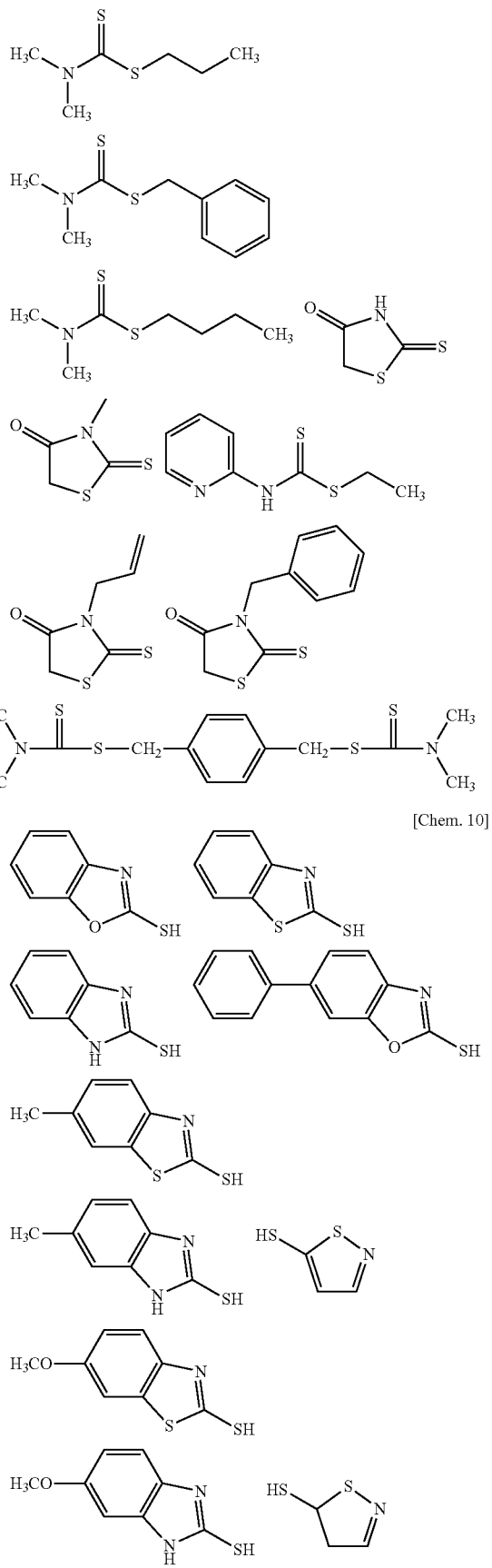

17
-continued
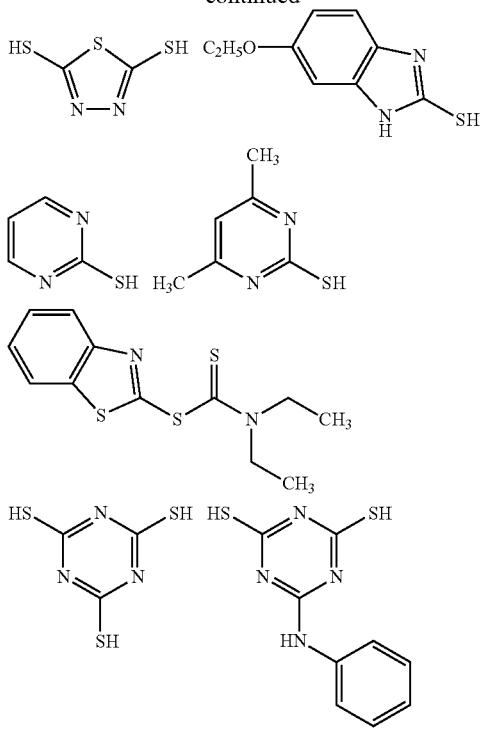
[Chem. 11]
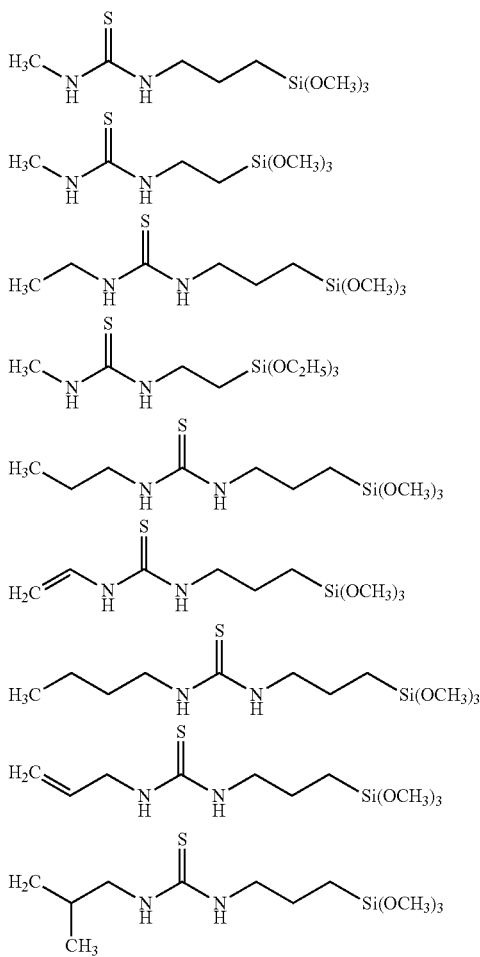
18
-continued
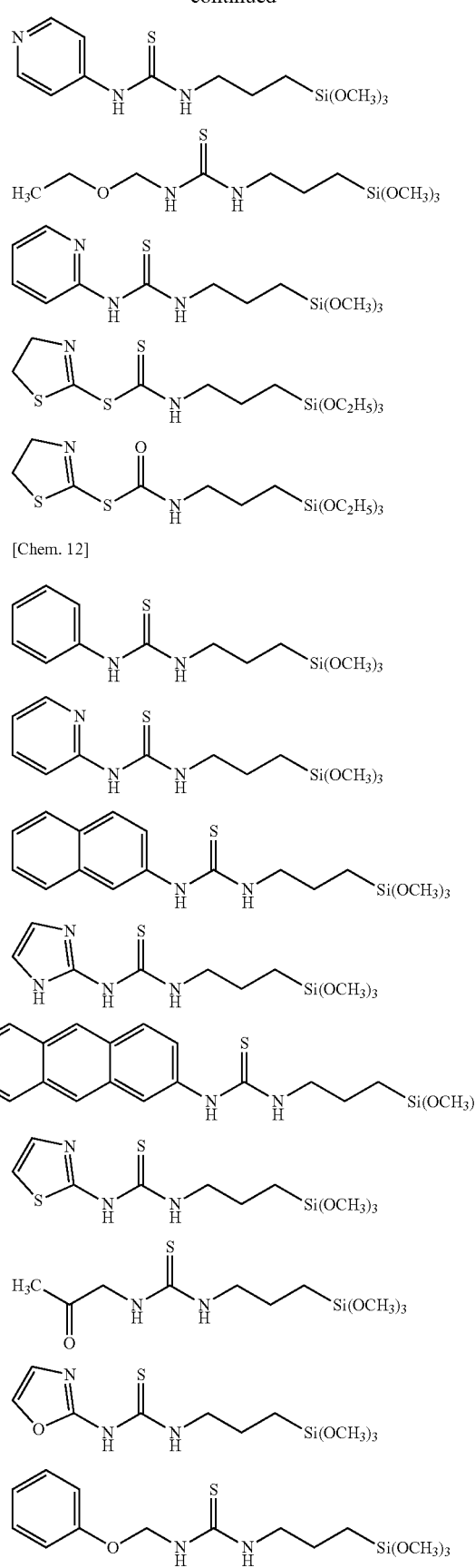

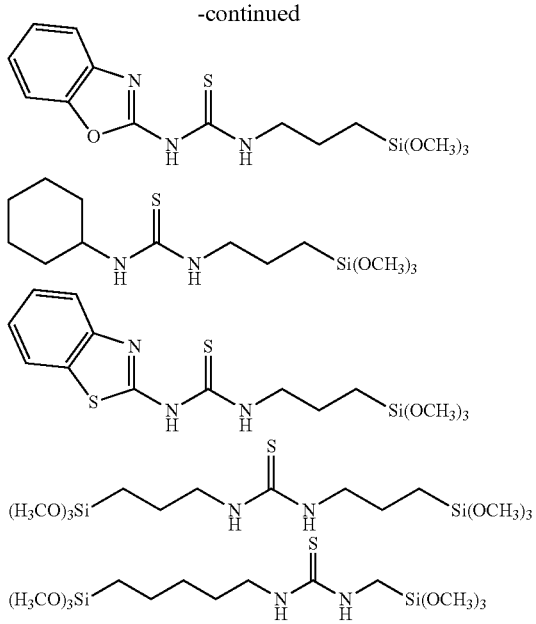

The following describes a method of forming a pattern of a heat-resistant resin from the photosensitive resin composition according to the present invention.

First, a method for using the photosensitive resin composition according to the present invention or a photosensitive sheet formed of the same to form a photosensitive resin composition film on a substrate will be described.

In a case in which a photosensitive resin composition is used, a substrate is first coated with the varnish. Examples of coating methods include methods such as spin coating using a spinner, spray coating, roll coating, and screen printing. In addition, the coating film thickness depends on the coating technique, the concentration of solid in the resin composition, the viscosity, and the like, but usually the varnish is preferably applied such that the film thickness achieved after drying is 0.5 µm to 100 µm. Next, the substrate coated with the photosensitive resin composition varnish is dried to afford a photosensitive resin composition film. For drying, an oven, a hot plate, infrared ray, and the like can be used. The drying temperature and the drying time have only to be in a range in which an organic solvent can be volatilized, and are preferably set, as appropriate, in a range such that the photosensitive resin composition film turns into the uncured or half-cured state. Specifically, it is preferably carried out in the range of 50° C. to 150° C. for one minute to several hours.

In another case in which the photosensitive sheet is used, a protective film, if any, is released, the photosensitive sheet is opposed to a substrate, and both of them are adhered together by thermo compression bonding to afford a photosensitive resin film. Thermo compression bonding can be carried out by thermal pressing, thermal laminating, thermal vacuum laminating, and the like. The temperature for adhering together is preferably 40° C. or more in view of the properties of adhesion and implantation to a substrate. In addition, the temperature for adhering together is preferably 150° C. or less in order to prevent the photosensitive sheet from being cured during adhering together and thereby deteriorating the resolution in pattern-forming in the processes of exposure and development.

In any case, examples of substrates used include, but are not limited to, silicon wafers, ceramics, gallium arsenic, organic circuit boards, inorganic circuit boards, and these substrates with components of a circuit disposed thereon. Examples of organic circuit boards include: glass-substrate copper-clad laminate sheets such as glass fabric/epoxy copper-clad laminate sheets; composite copper-clad laminate sheets such as glass nonwoven fabric/epoxy copper-clad laminate sheets; heat-resistant/thermoplastic substrates such as polyether imide resin substrates, polyether ketone resin substrates, and polysulfone resin substrates; flexible substrates such as polyester copper-clad film substrates, and polyimide copper-clad film substrates; and the like. In addition, examples of inorganic circuit boards include: ceramic substrates such as alumina substrates, aluminum nitride substrates, and silicon carbide substrates; and metallic substrates such as aluminum-based substrates and iron-based substrates. Examples of components of a circuit include: conductors containing metals such as silver, gold, and copper; resistance elements containing inorganic oxides and the like; low dielectric materials containing glass-based materials and/or resins and the like; high dielectric materials containing resins, high dielectric constant inorganic particles, and the like; insulating materials containing glass-based materials and the like; and the like.

Next, the photosensitive resin film formed by the aforementioned method is irradiated with actinic rays through a mask having a desired pattern and is exposed to light. Examples of actinic rays used for light exposure include ultraviolet rays, visible rays, electron rays, X-rays, and the like, and in the present invention, ultraviolet rays such as i-line (365 nm), h-line (405 nm), and g-line (436 nm) of a mercury lamp are preferably used. In a case in which a support for the photosensitive sheet is a material transparent to these rays, light exposure may be carried out without releasing the support from the photosensitive sheet.

To form a pattern, exposed parts are removed using a developing solution after light exposure. Examples of preferable developing solutions include: a tetramethylammonium hydroxide aqueous solution; and aqueous solutions of compounds exhibiting alkalinity such as diethanolamine, diethylaminoethanol, sodium hydroxide, potassium hydroxide, sodium carbonate, potassium carbonate, triethylamine, diethyl amine, methylamine, dimethylamine, dimethylaminoethyl acetate, dimethylaminoethanol, dimethylaminoethyl methacrylate, cyclohexylamine, ethylene diamine, and hexamethylene diamine. In some cases, these alkaline aqueous solutions may contain one kind of or a combination of two or more kinds of: polar solvents such as N-methyl-2-pyrrolidone, N,N-dimethyl formamide, N,N-dimethyl acetamide, dimethyl sulfoxide, γ-butyrolactone, and dimethyl acrylamide; alcohols such as methanol, ethanol, and isopropanol; esters such as ethyl lactate and propylene glycol monomethyl ether acetate; ketones such as cyclopentanone, cyclohexanone, isobutyl ketone, and methyl isobutyl ketone; and the like.

Development can be carried out by a method such that a coating surface is sprayed with the aforementioned developing solution, immersed in the developing solution, ultrasonicated while being immersed, or sprayed with the developing solution while the substrate is being rotated. Conditions for development such as a developing time and a developing solution temperature in a developing step have only to be conditions under which exposed parts are removed, and it is preferable that, even after exposed parts are removed, development be further carried out for micropatterning and for removing residues between patterns.

After development, rinse treatment may be carried out with water. Here, the rinse treatment may be carried out with water to which alcohols such as ethanol and isopropyl alcohol, esters such as ethyl lactate and propylene glycol monomethyl ether acetate, or the like are added.

A process of baking treatment may be introduced before development, if the process enhances a pattern resolution during development, or if the process widens the permissible ranges of developing conditions. The temperature for this is preferably in the range of 50 to 180° C., more preferably in the range of 80 to 150° C. in particular. The time is preferably 5 seconds to several hours.

After pattern-forming, heat-drying may be carried out in the range of 70 to 150° C. from the viewpoint of reducing solvent, volatile matter, and water that remain in the photosensitive resin film. The time is preferably 1 minute to several hours.

The substrate thus obtained which has a patterned photosensitive resin film formed thereon is made into a cured film by applying a temperature of 150° C. to 450° C. thereto. This heating treatment is carried out for 5 minutes to 10 hours while raising temperature to a selected temperature in a stepwise manner or while raising temperature continuously in a selected temperature range. As one example, the heat treatment is performed at 110° C. and 250° C., each for 60 minutes, or performed by raising temperature linearly from room temperature to 220° C. in 2 hours. In this case, the heat treatment is preferably carried out at 250° C. or less because high temperature heating and repetitions thereof may unfavorably change the electrical characteristics of the element and may unfavorably increase the warpage of the substrate. In addition, the heat treatment is more preferably carried out at 150° C. or more in order for the crosslinking to achieve impartation of chemical resistance and interaction between an adhesion-improving agent and the substrate. The photosensitive resin composition in the present invention can afford a cured film having an excellent adhesion and chemical resistance even when baked at a low temperature of 250° C. or less.

The cured resin film formed by curing the photosensitive resin composition or the photosensitive sheet according to the present invention can be used for electronic components of semiconductor devices and the like. The semiconductor devices mentioned in the present invention refer to devices in general which can function by utilizing the characteristics of semiconductor elements. Electro-optical devices and semiconductor circuit boards which both have semiconductor elements connected to a substrate, layered multiple semiconductor elements, and electronic devices including these are all encompassed in semiconductor devices. In addition, electronic components such as multilayer wiring boards for connecting semiconductor elements are encompassed in semiconductor devices. Specifically, the cured resin film is preferably used for applications such as for passivation films for semiconductors, surface protective films for semiconductor elements, interlayer dielectric films between semiconductor elements and wiring, interlayer dielectric films between a plurality of semiconductor elements, interlayer dielectric films between wiring layers of multilayer wiring for high-density packaging, and dielectric layers of organic electroluminescence elements, but is not limited thereto and used for various applications.

Next, examples of application of the photosensitive resin composition according to the present invention to semiconductor devices having a bump will be described with reference to the drawings. FIG. 1 is an enlarged cross-section view of a pad portion of a semiconductor device having a bump. As illustrated in FIG. 1, a silicon wafer 1 has an Al pad 2 for input/output thereon that has a passivation film 3 thereon, and the passivation film 3 has a via hole. Further on this, an insulating film 4 formed using the photosensitive resin composition according to the present invention is formed, and a metal film 5 composed of Cr, Ti, or the like is further formed so as to be connected to the Al pad 2. By etching the metal film 5 around a solder bump 10, the pads are insulated from one another. On the insulated pad, a barrier metal 8 and the solder bump 10 are formed. When a softening component is introduced into the photosensitive resin composition, wafer warpage is small, and hence light exposure and wafer transport can be carried out with high precision. In addition, polyimide resins and polybenzoxazole resins also have excellent mechanical characteristics and hence can relieve stress coming from a sealing resin even during packaging, accordingly prevent the low-k layer from being damaged, and provide semiconductor devices having a high reliability.

Next, a method for making a semiconductor device will be described in detail. In the process of 2a in FIG. 2, a silicon wafer 1 with an Al pad 2 and a passivation film 3 formed thereon is coated with the photosensitive resin composition according to the present invention, and undergoes a photolithography process to form a pattern-formed insulating film 4. Then, in the process of 2b, a metal film 5 is formed by a sputtering method. As shown by 2c in FIG. 2, metal wiring 6 is formed as a film on the metal film 5 by a plating method. Next, as shown by 2d' in FIG. 2, the film is coated with the photosensitive resin composition according to the present invention, and undergoes a photolithography process to form an insulating film 7 as a pattern as shown by 2d in FIG. 2. During this, the photosensitive resin composition as the insulating film 7 undergoes thick film processing at a scribe line 9. Further wiring (so-called rewiring) can be formed on the insulating film 7. For forming a bilayer or more multilayer wiring structure, the aforementioned processes are repeated, whereby a multilayer wiring structure having two or more rewiring layers separated by an interlayer dielectric film obtained from the photosensitive resin composition according to the present invention can be formed. During this, the insulating film formed has to come into contact with various liquid chemicals a plurality of times, but the insulating film obtained from the photosensitive resin composition according to the present invention has an excellent adhesion and chemical resistance, and hence can form a good multilayer wiring structure. The number of layers of the multilayer wiring structure has no upper limit but those having 10 or less layers are often used.

Then, as shown by 2e and 2f in FIG. 2, a barrier metal 8 and a solder bump 10 are formed. Then, the structure is diced along scribe lines 9 to be cut into individual chips. When the insulating film 7 has no pattern formed at the scribe lines 9 or has some residues there, cracks and the like are generated during dicing and affect the reliability of the chips. Because of this, the capability to provide an excellent thick film processing in patterning, as in the present invention, is very preferable for achieving the high reliability of semiconductor devices.

In addition, the photosensitive resin composition and the photosensitive sheet according to the present invention are preferably used for fan-out wafer level packages (fan-out WLP). A fan-out WLP is a semiconductor package in which a necessary number of terminals are ensured by providing the periphery of the semiconductor chip with a part extended using a sealing resin such as an epoxy resin, attaching rewiring from the electrode to the extended part on the semiconductor chip, and mounting a solder ball on the extended part also. In the fan-out WLP, wiring is installed so as to be across the borderline formed by the principal surface of the semiconductor chip and the principal surface of the sealing resin. In other words, an interlayer dielectric film is formed on a base material composed of two or more kinds of materials, i.e., a semiconductor chip and a sealing resin with metal wiring disposed on them, and wiring is formed on the interlayer dielectric film. Other than this, a semiconductor package of the type that has a semiconductor chip embedded in a concave part which is formed in a glass epoxy resin substrate has wiring installed so as to be across the borderline between the principal surface of the semiconductor chip and the principal surface of the printed board. Also in this aspect, an interlayer dielectric film is formed on a base material composed of two or more kinds of materials, and wiring is formed on the interlayer dielectric film. A cured film formed by curing the photosensitive resin composition or the photosensitive sheet according to the present invention has a high adhesion to a semiconductor chip with metal wiring, and also has a high adhesion to a sealing resin such as an epoxy resin, and hence is preferably used as an interlayer dielectric film laid on a substrate composed of two or more kinds of materials.

EXAMPLES

The present invention will be described below by way of Examples, but the present invention is not limited thereto. First, the evaluation procedures in the respective Examples and Comparative Examples will be described. A photosensitive resin composition (hereinafter referred to as varnish) filtered through a 1 μm thick filter made of polytetrafluoroethylene (manufactured by Sumitomo Electric Industries, Ltd.) in advance was used for evaluation.

(1) Measurement of Molecular Weight

The molecular weight of the component (A) resin was measured using a GPC (gel permeation chromatography) device Waters 2690-996 (manufactured by Nihon Waters K.K.) with N-methyl-2-pyrrolidone (hereinafter referred to as "NMP") as a developing solvent, and the weight-average molecular weight (Mw) and dispersity (PDI=Mw/Mn) were calculated in terms of polystyrene. The molecular weight of the $Y^2$ component in the component (A) resin can be measured with respect to a diamine monomer including a $Y^2$ structure by LC-MS (Q Exactive, manufactured by Thermo Scientific, Inc.), and be determined as a molecular weight of a main signal.

(2) Evaluation on Sensitivity

Varnish was applied to an 8-inch silicon wafer by a spin-coating method using a coating/developing device ACT-8 (manufactured by Tokyo Electron Limited) such that the varnish would have a film thickness of 10 μm when prebaked later at 120° C. for 3 minutes. Using an exposure device i-line stepper NSR-2005i9C (manufactured by Nikon Corporation), the prebaked substrate was exposed to light. After the exposure, using the developing device ACT-8, development with a 2.38 mass % tetramethylammonium solution (hereinafter referred to as TMAH, manufactured by Tama Chemicals Co., Ltd.) was repeated two times by a paddle method (an ejection time of a developing solution of 10 seconds and a paddle time of 40 seconds), followed by rinsing with pure water and further draining and drying. The minimum light exposure at which the exposed area was completely dissolved was regarded as sensitivity. The case where sensitivity is 500 mJ/cm$^2$ or more or where the exposed parts did not completely dissolve and left some residues was rated as poor (1), the case where sensitivity is 300 mJ/cm$^2$ or more and less than 500 mJ/cm$^2$ was rated as good (2), and the case where sensitivity is less than 300 mJ/cm$^2$ was rated as extremely good (3).

(3) Evaluation on Stress

Varnish was applied to a silicon wafer by a spin-coating method using the coating/developing device ACT-8 such that the varnish would have a film thickness of 10 μm when prebaked later at 120° C. for 3 minutes, and the varnish on the wafer was prebaked, then heated using the inert oven CLH-21CD-S at a heating rate of 3.5° C./minute to 220° C. under a nitrogen gas stream at an oxygen concentration of 20 ppm or less, and heat-treated at 220° C. for 1 hour. Upon reaching a temperature of 50° C. or lower, the silicon wafer was taken out and the cured film was measured using a stress measurement system FLX2908 (manufactured by KLA-Tencor Corporation). The case where stress is 30 MPa or more was rated as 1, the case where stress is 20 MPa or more and less than 30 MPa was rated as 2, and the case where stress is less than 20 MPa was rated as 3.

(4) Evaluation on Degree of Elongation

Varnish was applied to an 8-inch silicon wafer by a spin-coating method using the coating/developing device ACT-8 such that the varnish would have a film thickness of 11 μm when prebaked later at 120° C. for 3 minutes, and the varnish on the wafer was prebaked, then heated using the inert oven CLH-21CD-S (manufactured by Koyo Thermo Systems Co., Ltd.) at 3.5° C./minute to 220° C. at an oxygen concentration of 20 ppm or less, and heat-treated at 220° C. for 1 hour. When the temperature became 50° C. or less, the wafer was taken out and immersed in a 45 mass % hydrofluoric acid for 5 minutes to thereby release the resin composition film from the wafer. This film was cut into 1 cm wide×9 cm long strips, which were pulled using the TENSILON RTM-100 (manufactured by Orientec Corporation) at a tension rate of 50 mm/minute at a room temperature of 23.0° C. and a humidity of 45.0% RH, and measured for elongation at break. Ten strips per specimen were measured, and an average value was determined from the top five results. The case where a value of elongation at break was 60% or more was rated as 3, the case where a value of elongation at break was 30% or more and less than 60% was rated as 2, and the case where a value of elongation at break was less than 30% was rated as 1.

(5) Adhesion Test

The adhesion to metal materials were tested by the following method.

Making of Cured Film

Copper was sputtered onto a silicon wafer to prepare a substrate having a metal material layer 200 to 500 nm thick formed on the surface (copper-sputtered substrate). Varnish was applied onto this substrate by a spin-coating method using a spinner (manufactured by Mikasa Co., Ltd.), and then baked on a hot plate (D-SPIN, manufactured by Dai Nippon Screen Manufacturing Co., Ltd) at 120° C. for 3 minutes to make a prebaked film which was finally 8 μm thick. These films were cured under a nitrogen gas stream (the oxygen concentration: 20 ppm or less) using the clean oven (CLH-21CD-S, manufactured by Koyo Thermo Systems Co., Ltd.) at 110° C. for 30 minutes and then at a raised temperature of 220° C. for further 1 hour to afford a photosensitive cured resin film.

Evaluation on Adhesion

The substrate was divided into two portions, and a single edged knife was used to make an incision in the form of a grid of 10 columns and 10 rows in the cured film on each substrate, each column and each row being 2 mm wide. One of the sample substrates was used to count how many out of the 100 cells were removed by peeling-off using Cello-tape (registered trademark), and was evaluated for the adhesion between the metal material and the cured resin film. On the other hand, a pressure cooker test (PCT) device (HAST CHAMBER EHS-211MD, manufactured by Tabai Espec Corporation) was used to treat the other sample substrate for PCT under the saturation conditions at 121° C. at 2 atmospheres for 200 hours, and then the peeling-off test as described above was carried out. The case where the number of pieces peeled off the substrate in the peeling-off test was less than 10 was rated as 2 (good), and the case where the number of pieces peeled off the substrate in the peeling-off test was 10 or more was rated as 1 (poor).

Method of Measuring Film Thickness

The thicknesses of the prebaked films which were developed were measured using the Lambda Ace STM-602 manufactured by Dainippon Screen Manufacturing Co., Ltd. under the assumption that the refractive index was 1.629, and the thicknesses of the cured films were measured under the assumption that the refractive index was 1.773.

Synthesis Example 1: Synthesis of Alkaline-Solution-Soluble Polyamide Resin (A-1)

Under a dry nitrogen gas stream, 2,2-bis(3-amino-4-hydroxyphenyl)hexafluoropropane (hereinafter referred to as BAHF) (25.64 g, 0.070 mol) was dissolved in 185 g of NMP. To this 1,1'-(4,4'-oxybenzoyl)diimidazole (hereinafter referred to as PBOM) (17.20 g, 0.048 mol) together with 20 g of NMP was added, and the resulting mixture was allowed to react at 85° C. for 3 hours. Then, to this, 1,12-diaminododecane (5.01 g, 0.025 mol), 1,3-bis(3-aminopropyl)tetramethyldisiloxane (1.24 g, 0.0050 mol), and PBOM (14.33 g, 0.044 mol), together with 30 g of NMP, were added, and the resulting mixture was allowed to react at 85° C. for 1 hour. Further, to this, 5-norbornene-2,3-dicarboxylic anhydride (3.94 g, 0.024 mol) as a terminal blocking agent, together with 10 g of NMP was added, and the resulting mixture was allowed to react at 85° C. for 30 minutes. After completion of the reaction, the reaction solution was cooled to room temperature, to which acetic acid (26.41 g, 0.50 mol), together with 58 g of NMP, was added, and the resulting mixture was stirred at room temperature for 1 hour. After the stirring was finished, the solution was poured into 3 L of water to obtain white precipitate. This precipitate was collected by filtration, washed with water 3 times, dried in a forced-air dryer at 50° C. for 3 days to afford an alkali-soluble polyamide resin (A-1) in powder form. As the result of evaluation by the above-described method, the weight-average molecular weight of the resin (A-1) was 33,000, and the PDI was 2.1.

Synthesis Example 2: Synthesis of Alkali-Soluble Polyamide Resin (A-2)

In the same manner as in the above-described Synthesis Example 1, BAHF (25.64 g, 0.070 mol), PBOM (31.53 g, 0.088 mol), D-400 having a propylene oxide structure (10.00 g, 0.025 mol), 1,3-bis(3-aminopropyl)tetramethyldisiloxane (1.24 g, 0.0050 mol), 5-norbornene-2,3-dicarboxylic anhydride (3.94 g, 0.024 mol), acetic acid (26.41 g, 0.50 mol), and 300 g of NMP were used for synthesis to afford an alkali-soluble polyamide resin (A-2) in powder form. As the result of evaluation by the above-described method, the weight-average molecular weight of the resin (A-2) was 34,000, and the PDI was 2.2.

Synthesis Example 3: Synthesis of Alkali-Soluble Polyamide Resin (A-3)

In the same manner as in the above-described Synthesis Example 1, BAHF (25.64 g, 0.070 mol), PBOM (31.53 g, 0.088 mol), ED-600 having structures of ethylene oxide and propylene oxide (15.00 g, 0.025 mol), 1,3-bis(3-aminopropyl)tetramethyldisiloxane (1.24 g, 0.0050 mol), 5-norbornene-2,3-dicarboxylic anhydride (3.94 g, 0.024 mol), acetic acid (26.41 g, 0.50 mol), and 300 g of NMP were used for synthesis to afford an alkali-soluble polyamide resin (A-3) in powder form. As the result of evaluation by the above-described method, the weight-average molecular weight of the resin (A-3) was 34,000, and the PDI was 2.3.

Synthesis Example 4: Synthesis of Alkali-Soluble Polyamide Resin (A-4)

In the same manner as in the above-described Synthesis Example 1, BAHF (25.64 g, 0.070 mol), PBOM (31.53 g, 0.088 mol), ED-900 having structures of ethylene oxide and propylene oxide (22.50 g, 0.025 mol), 1,3-bis(3-aminopropyl)tetramethyldisiloxane (1.24 g, 0.0050 mol), 5-norbornene-2,3-dicarboxylic anhydride (3.94 g, 0.024 mol), acetic acid (26.41 g, 0.50 mol), and 300 g of NMP were used for synthesis to afford an alkali-soluble polyamide resin (A-4) in powder form. As the result of evaluation by the above-described method, the weight-average molecular weight of the resin (A-4) was 41,000, and the PDI was 2.4.

Synthesis Example 5: Synthesis of Alkali-Soluble Polyamide Resin (A-5)

In the same manner as in the above-described Synthesis Example 1, BAHF (12.82 g, 0.035 mol), 3,3'-diamino-4,4'-dihydroxydiphenylsulfone (hereinafter referred to as DABS) (9.81 g, 0.035 mol), PBOM (31.53 g, 0.088 mol), ED-900 (22.50 g, 0.025 mol), 1,3-bis(3-aminopropyl)tetramethyldisiloxane (1.24 g, 0.0050 mol), 5-norbornene-2,3-dicarboxylic anhydride (3.94 g, 0.024 mol), acetic acid (26.41 g, 0.50 mol), and 300 g of NMP were used for synthesis to afford an alkali-soluble polyamide resin (A-5) in powder form.

As the result of evaluation by the above-described method, the weight-average molecular weight of the resin (A-5) was 51,000, and the PDI was 2.4.

Synthesis Example 6: Synthesis of Alkali-Soluble Polyamide Resin (A-6)

In the same manner as in the above-described Synthesis Example 1, BAHF (25.64 g, 0.070 mol), PBOM (31.53 g, 0.088 mol), RT-1000 having structures of propylene oxide and tetramethylene oxide (25.00 g, 0.025 mol), 1,3-bis(3-aminopropyl)tetramethyldisiloxane (1.24 g, 0.0050 mol), 5-norbornene-2,3-dicarboxylic anhydride (3.94 g, 0.024 mol), acetic acid (26.41 g, 0.50 mol), and 300 g of NMP were used for synthesis to afford an alkali-soluble polyamide resin (A-6) in powder form. As the result of evaluation by the above-described method, the weight-average molecular weight of the resin (A-6) was 37,000, and the PDI was 1.8.

Synthesis Example 7: Synthesis of Alkali-Soluble Polyamide Resin (A-7)

In the same manner as in the above-described Synthesis Example 1, BAHF (27.47 g, 0.075 mol), PBOM (31.53 g, 0.088 mol), RT-1000 (20.00 g, 0.020 mol), 1,3-bis(3-aminopropyl)tetramethyldisiloxane (1.24 g, 0.0050 mol), 5-norbornene-2,3-dicarboxylic anhydride (3.94 g, 0.024 mol), acetic acid (26.41 g, 0.50 mol), and 300 g of NMP were used for synthesis to afford an alkali-soluble polyamide resin (A-7) in powder form. As the result of evaluation by the above-described method, the weight-average molecular weight of the resin (A-7) was 44,000, and the PDI was 2.2.

Synthesis Example 8: Synthesis of Alkali-Soluble Polyamide Resin (A-8)

In the same manner as in the above-described Synthesis Example 1, BAHF (25.64 g, 0.070 mol), PBOM (31.53 g, 0.088 mol), ED-2003 having structures of ethylene oxide and propylene oxide (50.00 g, 0.025 mol), 1,3-bis(3-aminopropyl)tetramethyldisiloxane (1.24 g, 0.0050 mol), 5-norbornene-2,3-dicarboxylic anhydride (3.94 g, 0.024 mol), acetic acid (26.41 g, 0.50 mol), and 300 g of NMP were used for synthesis to afford an alkali-soluble polyamide resin (A-8) in powder form. As the result of evaluation by the above-described method, the weight-average molecular weight of the resin (A-8) was 52,000, and the PDI was 2.1.

Synthesis Example 9: Synthesis of Alkali-Soluble Polyamide Resin (A-9)

In the same manner as in the above-described Synthesis Example 1, BAHF (34.79 g, 0.095 mol), PBOM (31.53 g, 0.088 mol), 1,3-bis(3-aminopropyl)tetramethyldisiloxane (1.24 g, 0.0050 mol), 5-norbornene-2,3-dicarboxylic anhydride (3.94 g, 0.024 mol), acetic acid (26.41 g, 0.50 mol), and 300 g of NMP were used for synthesis to afford an alkali-soluble polyamide resin (A-9) in powder form. As the result of evaluation by the above-described method, the weight-average molecular weight of the resin (A-9) was 38,000, and the PDI was 1.6.

Synthesis Example 10: Synthesis of Alkali-Soluble Polyamide Resin (A-10)

In the same manner as in the above-described Synthesis Example 1, BAHF (12.82 g, 0.035 mol), PBOM (31.53 g, 0.088 mol), RT-1000 (120.00 g, 0.060 mol), 1,3-bis(3-aminopropyl)tetramethyldisiloxane (1.24 g, 0.0050 mol), 5-norbornene-2,3-dicarboxylic anhydride (3.94 g, 0.024 mol), acetic acid (26.41 g, 0.50 mol), and 300 g of NMP were used for synthesis to afford an alkali-soluble polyamide resin (A-10) in powder form. As the result of evaluation by the above-described method, the weight-average molecular weight of the resin (A-10) was 43,000, and the PDI was 2.5.

Synthesis Example 11: Synthesis of Novolac Resin (A-11)

Under a dry nitrogen gas stream, m-cresol (70.2 g, 0.65 mol), p-cresol (37.8 g, 0.35 mol), 37 mass % formaldehyde aqueous solution (75.5 g, (0.93 mol of formaldehyde)), oxalic acid dihydrate (0.63 g, 0.005 mol), and 264 g of methyl isobutyl ketone were mixed for use, and the resulting mixture was immersed in an oil bath, and the reaction liquid was subjected to a polycondensation reaction at reflux for 4 hours. After that, the temperature of the oil bath was raised over 3 hours, the pressure inside the flask was reduced to 30 to 50 mmHg, a volatile component was removed, and the resin dissolved in the liquid was cooled to room temperature, to obtain a novolac resin (A-11) in powder form. As the result of evaluation by the above-described method, the weight-average molecular weight of the resin (A-11) was 3,500, and the PDI was 2.8.

Synthesis Example 12: Synthesis of Polybenzoxazole Precursor (A-12)

Under a dry nitrogen gas stream, 100 g of N-methylpyrrolidone was made ready for use, to which 2,2-bis(3-amino-4-hydroxyphenyl)hexafluoropropane (32.96 g, 0.090 mol) and m-aminophenol (2.18 g, 0.020 mol) were added; the resulting mixture was stirred and dissolved at room temperature; to this, dodecanedioic acid dichloride (20.04 g, 0.075 mol) was added dropwise in 10 minutes while the temperature of the reaction solution was maintained at −10 to 0° C.; to this, then, 4,4'-diphenyl ether dicarboxylic acid chloride (7.38 g, 0.025 mol) was added; and the resulting mixture was continuously stirred at room temperature for 3 hours. The reaction solution was poured into 3 liters of water to collect precipitate, and the precipitate was washed with pure water 3 times and then dried in a forced-air dryer at 50° C. for 3 days to afford a polybenzoxazole precursor resin (A-12) in powder form. As the result of evaluation by the above-described method, the weight-average molecular weight of the resin (A-12) was 31,000, and the PDI was 2.3.

Synthesis Example 13: Synthesis of Cyclized Polyimide (A-13)

Under a dry nitrogen gas stream, BAHF (31.13 g, 0.085 mol), 1,3-bis(3-aminopropyl)tetramethyldisiloxane (1.24 g, 0.0050 mol), and m-aminophenol (2.18 g, 0.020 mol) were dissolved in 250 g of NMP. To this, 4,4'-oxydiphthalic anhydride (31.02 g, 0.10 mol) together with 50 g of NMP was added, and the resulting mixture was allowed to react at 60° C. for 1 hour and then stirred at 200° C. for 4 hours. After the stirring was finished, the solution was poured into 3 L of water to obtain white precipitate. The precipitate was collected by filtration, washed with water three times, and then dried in a forced-air dryer at 50° C. for 3 days, to obtain a cyclized polyimide resin (A-13) in powder form. As the result of evaluation by the above-described method, the weight-average molecular weight of the resin (A-13) was 27,000, and the PDI was 2.0.

Examples 1 to 8, Comparative Examples 1 TO 5

To 10 g each of the resulting resins (A-1 to -13), 2.0 g of a photo acid generator represented by the following formula as the component (B), 0.5 g of HMOM-TPHAP as a thermal crosslinking agent (C), 0.5 g of MW-100LM, and 20 g of γ-butyrolactone as a solvent were added to produce varnishes, and their characteristics were measured by the above-described evaluation method. The results obtained are shown in Table 1.

Example 9

To 10 g of the resulting resin (A-6), 2.0 g of a photo acid generator represented by the following formula as the component (B) and 20 g of γ-butyrolactone as a solvent were added to produce a varnish, and its characteristics were measured by the above-described evaluation method. The results obtained are shown in Table 1.

[Chem. 13]

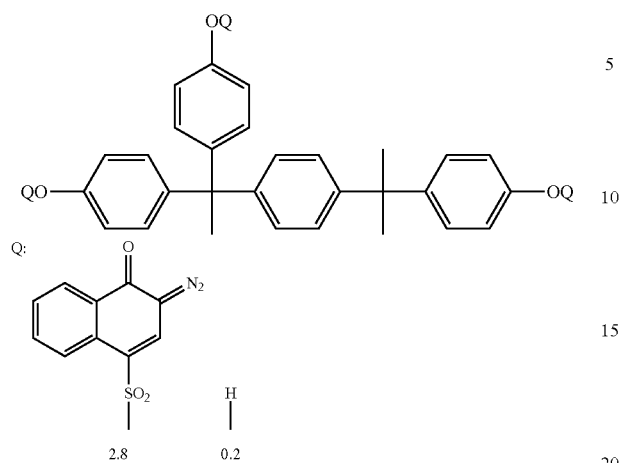

Examples 10 to 19, Comparative Examples 6 TO 9

To each of the varnishes obtained from Example 4 or 7, 0.02 g, 0.06 g, 0.2 g, 0.5 g, or 1.5 g of the compound represented by the following formula as the compound (D) was added, and the characteristics of the resulting products were measured by the above-described evaluation method. The results obtained are shown in Table 2.

[Chem. 14]

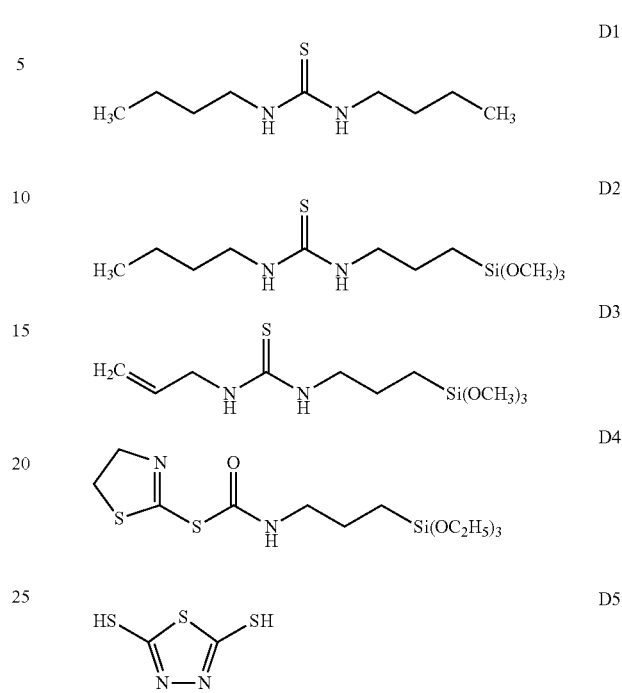

TABLE 1

| | Polymer | Component (A) Aromatic Diamine Component | Aliphatic Diamine Component | Sensitivity | Warpage Stress (Stress) (MPa) | | Degree of Elongation (%) | | $Y^2$ Molecular Weight |
|---|---|---|---|---|---|---|---|---|---|
| Example 1 | A-1 | BAHF | 1,12 diamino-dodecane | 2 | 25 | 2 | 35 | 2 | 168 |
| Example 2 | A-2 | BAHF | D-400 | 2 | 23 | 2 | 37 | 2 | 400 |
| Example 3 | A-3 | BAHF | ED-600 | 2 | 20 | 2 | 41 | 2 | 600 |
| Example 4 | A-4 | BAHF | ED-900 | 3 | 15 | 3 | 42 | 2 | 900 |
| Example 5 | A-5 | BAHF/DABS | ED-900 | 3 | 19 | 3 | 40 | 2 | 900 |
| Example 6 | A-6 | BAHF | RT-1000 | 3 | 14 | 3 | 65 | 3 | 1000 |
| Example 7 | A-7 | BAHF | RT-1000 | 3 | 19 | 3 | 63 | 3 | 1000 |
| Example 8 | A-8 | BAHF | ED-2003 | 2 | 13 | 3 | 69 | 3 | 2000 |
| Example 9 | A-6 | BAHF | RT-1000 | 2 | 8 | 3 | 92 | 3 | 1000 |
| Comparative Example 1 | A-9 | BAHF | none | 2 | 33 | 1 | 61 | 3 | — |
| Comparative Example 2 | A-10 | BAHF | RT-1000 | 1 | 12 | 3 | 76 | 3 | 1000 |
| Comparative Example 3 | A-11 | novolac resin | | 3 | 25 | 2 | no film-forming and no evaluation | | — |
| Comparative Example 4 | A-12 | polybenzoxazole precursor | | 2 | 35 | 1 | 83 | 3 | — |
| Comparative Example 5 | A-13 | cyclized polyimide | | 2 | 25 | 2 | 20 | 1 | — |

TABLE 2

| | Base Composition | Component (D) | Amount Added | Sensitivity | Adhesion to Copper | $Y^2$ Molecular Weight |
|---|---|---|---|---|---|---|
| Example 10 | Example 4 | D1 | 0.02 g | 3 | 2 | 900 |
| Example 11 | Example 7 | D1 | 0.02 g | 3 | 2 | 1000 |
| Example 12 | Example 7 | D1 | 0.06 g | 3 | 2 | 1000 |

TABLE 2-continued

| | Base Composition | Component (D) | | Sensitivity | Adhesion to Copper | $Y^2$ Molecular Weight |
|---|---|---|---|---|---|---|
| | | | Amount Added | | | |
| Example 13 | Example 7 | D1 | 0.20 g | 2 | 2 | 1000 |
| Example 14 | Example 7 | D1 | 0.50 g | 2 | 2 | 1000 |
| Example 15 | Example 7 | D2 | 0.02 g | 3 | 2 | 1000 |
| Example 16 | Example 7 | D2 | 0.20 g | 2 | 2 | 1000 |
| Example 17 | Example 7 | D3 | 0.02 g | 3 | 2 | 1000 |
| Example 18 | Example 7 | D4 | 0.02 g | 3 | 2 | 1000 |
| Example 19 | Example 7 | D5 | 0.02 g | 3 | 2 | 1000 |
| Comparative Example 6 | Example 7 | D1 | none | 3 | 1 | 1000 |
| Comparative Example 7 | Example 7 | D1 | 1.5 g | 1 | 2 | 1000 |
| Comparative Example 8 | Example 7 | D2 | none | 3 | 1 | 1000 |
| Comparative Example 9 | Example 7 | D2 | 1.5 g | 1 | 2 | 1000 |

REFERENCE SIGNS LIST

1: Silicon wafer
2: Al pad
3: Passivation film
4: Dielectric film
5: Metal film (Cr, Ti, or the like)
6: Metal wiring (Al, Cu, or the like)
7: Dielectric film
8: Barrier metal
9: Scribe line
10: Solder bump

The invention claimed is:

1. A photosensitive resin composition comprising an alkali-soluble resin having an organic group derived from an aliphatic diamine,
wherein the alkali-soluble resin having the organic group derived from the aliphatic diamine is (A) an alkali-soluble polyamide represented by the general formula (1):

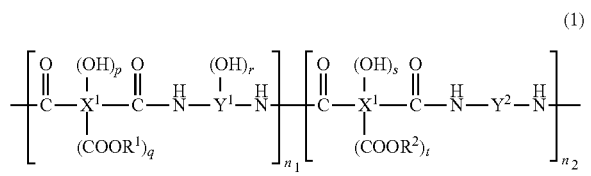

(1)

wherein, in the general formula (1):
$X^1$ and $X^2$ each represents a bi- to deca-valent organic group;
$Y^1$ represents a bi- to tetravalent organic group;
$Y^2$ has a structural unit represented by the general formula (2):

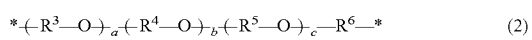

(2)

wherein, in the general formula (2), $R^3$ to $R^6$ each independently represents a $C_2$-$C_{10}$ alkylene group;
a, b, and c each are integers satisfying $0 \leq a \leq 20$, $0 \leq b \leq 20$, and $0 \leq c \leq 20$;
the repeating units are arranged in blocks or randomly; and
"*" in the general formula (2) represents a chemical bond;
$R^1$ and $R^2$ each represents a hydrogen or a $C_1$-$C_{20}$ organic group;
p, q, r, s, and t are integers satisfying $0 \leq p \leq 4$, $0 \leq q \leq 4$, $0 \leq r \leq 2$, $0 \leq s \leq 4$, and $0 \leq t \leq 4$;
when p, q, r, s, or t is 0, each group represents a hydrogen atom; and
$n_1$ and $n_2$ are integers satisfying $1 \leq n_1 \leq 500$, $1 \leq n_2 \leq 500$, and $0.05 \leq n_1/(n_1+n_2) < 1$; and
wherein $Y^2$ in the general formula (1) has a molecular weight of from not less than 900 to not more than 2,000.

2. The photosensitive resin composition according to claim 1, comprising (A) the alkali-soluble polyamide represented by the general formula (1), (B) a compound that generates an acid by light, and (C) a thermal crosslinking agent.

3. The photosensitive resin composition according to claim 1, further comprising (D) a compound represented by the general formula (3):

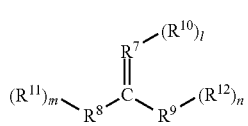

(3)

wherein, in the general formula (3), $R^7$ to $R^9$ represent an O atom, a S atom, or a N atom;
at least one of $R^7$ to $R^9$ represents a S atom;
l is 0 or 1;
m and n represents an integer of 0 to 2; and
$R^{10}$ to $R^{12}$ each independently represent a hydrogen atom or a $C_1$-$C_{20}$ organic group.

4. A photosensitive sheet formed of the photosensitive resin composition according to claim 1.

5. A method for producing a photosensitive sheet, comprising the step of coating a base material with the photosensitive resin composition according to claim 1 and drying the composition.

6. A cured film obtained by curing the photosensitive resin composition according to claim 1.

7. A cured film obtained by curing the photosensitive sheet according to claim 4.

8. An interlayer dielectric film or a semiconductor protective film comprising the cured film according to claim 6.

9. A method for producing a cured relief pattern, comprising the steps of:
coating a substrate with the photosensitive resin composition according to claim 1 and drying the composition to form a photosensitive resin film;
exposing the photosensitive resin film to light through a mask;
developing the photosensitive resin film by dissolving or removing the exposed parts using an alkaline solution; and
heating the developed photosensitive resin film.

10. A method for producing a semiconductor electronic component or a semiconductor device, comprising the steps of:
laminating the photosensitive sheet according to claim 4 on a substrate;
then carrying out a UV-irradiation step and a developing step to form a pattern thereon; and
further heating the resultant to form a relief pattern layer of a cured film.

11. A semiconductor electronic component or a semiconductor device comprising the relief pattern layer of the cured film according to claim 6.

12. The semiconductor electronic component or the semiconductor device according to claim 11, wherein the cured film is disposed as an interlayer dielectric film between rewiring layers.

13. The semiconductor electronic component or the semiconductor device according to claim 12, wherein layers each including the rewiring layer and interlayer dielectric film are disposed one on another two- to ten-fold.

14. The semiconductor electronic component or the semiconductor device, wherein the cured film according to claim 6 is disposed as an interlayer dielectric film covering two or more adjacent substrates made of different kinds of materials.

* * * * *